(12) United States Patent
Zhang et al.

(10) Patent No.: US 11,346,920 B2
(45) Date of Patent: May 31, 2022

(54) RADAR COMPONENT PACKAGE AND METHOD FOR MANUFACTURING THE SAME

(71) Applicant: National Center for Advanced Packaging Co., LTD., Wuxi (CN)

(72) Inventors: Wenqi Zhang, Wuxi (CN); Feng Chen, Wuxi (CN)

(73) Assignee: National Center For Advanced Packaging Co., Ltd, Wuxi (CN)

( * ) Notice: Subject to any disclaimer, the term of this patent is extended or adjusted under 35 U.S.C. 154(b) by 947 days.

(21) Appl. No.: 16/080,655

(22) PCT Filed: Nov. 27, 2017

(86) PCT No.: PCT/CN2017/113113
§ 371 (c)(1),
(2) Date: Aug. 28, 2018

(87) PCT Pub. No.: WO2019/033608
PCT Pub. Date: Feb. 21, 2019

(65) Prior Publication Data
US 2021/0181297 A1  Jun. 17, 2021

(30) Foreign Application Priority Data

Aug. 18, 2017 (CN) .......................... 201710709853.6
Aug. 18, 2017 (CN) .......................... 201710717924.7

(51) Int. Cl.
*G01S 7/03* (2006.01)
*H01L 21/48* (2006.01)
(Continued)

(52) U.S. Cl.
CPC .......... *G01S 7/032* (2013.01); *H01L 21/4817* (2013.01); *H01L 21/4853* (2013.01);
(Continued)

(58) Field of Classification Search
CPC ..... G01S 7/032; G01S 7/028; H01L 21/4817; H01L 21/4853; H01L 21/4857;
(Continued)

(56) References Cited

U.S. PATENT DOCUMENTS

| 2007/0164420 A1 | 7/2007 | Chen et al. |
| 2018/0003754 A1* | 1/2018 | Schrattenecker .... H01Q 1/2283 |
| 2018/0259384 A1* | 9/2018 | Baur ...................... H01L 23/66 |

FOREIGN PATENT DOCUMENTS

| CN | 1498417 A | 5/2004 |
| CN | 1937225 A | 3/2007 |

(Continued)

OTHER PUBLICATIONS

International Search Report and Written Opinion in corresponding PCT Application No. PCT/CN2017/113113, dated May 24, 2018, 9 pages.

*Primary Examiner* — Marc Anthony Armand
(74) *Attorney, Agent, or Firm* — Bayes PLLC

(57) ABSTRACT

The present invention relates to a millimeter wave radar component package, comprising: a box cover, having a metal layer arranged on inner surface of the box cover, the metal layer facing a channel of a box body, wherein a cavity is formed between the box cover and the box body; and the box body, comprising: a first insulator, connected with the box cover, wherein in the first insulator a channel is opened, and one end of the channel corresponds with the position of antenna and the other end is connected with the cavity; one or more chips, arranged on a second insulator in a flip manner and covered by the first insulator; the second insulator, arranged between the first insulator and a third insulator; the third insulator; and the antenna and conductive lines, arranged in the third insulator and connected with pads of the one or more chips through the second insulator, wherein the conductive lines are exposed from the third
(Continued)

insulator for electrical contact. The present invention further relates to a method for manufacturing the package.

14 Claims, 5 Drawing Sheets

(51) Int. Cl.
| | |
|---|---|
| H01L 21/54 | (2006.01) |
| H01L 21/56 | (2006.01) |
| H01L 23/053 | (2006.01) |
| H01L 23/20 | (2006.01) |
| H01L 23/31 | (2006.01) |
| H01L 23/538 | (2006.01) |
| H01L 23/66 | (2006.01) |
| H01L 23/00 | (2006.01) |
| H01Q 1/22 | (2006.01) |
| H01Q 23/00 | (2006.01) |
| G01S 7/02 | (2006.01) |

(52) U.S. Cl.
CPC .......... *H01L 21/4857* (2013.01); *H01L 21/54* (2013.01); *H01L 21/565* (2013.01); *H01L 21/568* (2013.01); *H01L 23/053* (2013.01); *H01L 23/20* (2013.01); *H01L 23/3128* (2013.01); *H01L 23/5383* (2013.01); *H01L 23/5386* (2013.01); *H01L 23/5389* (2013.01); *H01L 23/66* (2013.01); *H01L 24/19* (2013.01); *H01L 24/20* (2013.01); *H01Q 1/2283* (2013.01); *H01Q 23/00* (2013.01); *G01S 7/028* (2021.05); *H01L 2223/6677* (2013.01); *H01L 2224/214* (2013.01)

(58) Field of Classification Search
CPC ..... H01L 21/54; H01L 21/565; H01L 23/053; H01L 23/20; H01L 23/3128; H01L 23/5383; H01L 23/5386; H01L 23/5389
See application file for complete search history.

(56) References Cited

FOREIGN PATENT DOCUMENTS

| | | |
|---|---|---|
| CN | 103247581 A | 8/2013 |
| CN | 103329349 A | 9/2013 |
| CN | 104916892 A | 9/2015 |
| CN | 105374802 A | 3/2016 |
| CN | 103779319 A | 5/2018 |

* cited by examiner

RADAR COMPONENT PACKAGE AND METHOD FOR MANUFACTURING THE SAME

CROSS REFERENCE TO RELATED APPLICATIONS

This application is a national stage application of International Application No. PCT/CN2017/113113, filed on Nov. 27, 2017, which claims priorities to Chinese Patent Application Nos. 201710709853.6, filed on Aug. 18, 2017, and 201710717924.7, filed on Aug. 18, 2017, all of which are hereby incorporated by reference in their entireties.

TECHNICAL FIELD

The invention relates generally to the field of semiconductor manufacture, and specifically, to a millimeter wave radar component package and a method for manufacturing such millimeter wave radar component package.

BACKGROUND

As the consumption products are increasingly diversified in their functions, there is a need for wireless detection (for example detecting moving object and its speed) in many domains such as automobile, rotor, smart phone and etc., therefore, the application of the millimeter wave radar component is increased day by day. However, applications in many domains such as smart phone, balloon, airship and etc. have strict requirements on the dimensions and weight of the millimeter wave radar component, therefore, the engineers are always attempting to increase integration of the millimeter wave radar component package in order to reduce its weight and dimensions.

A Chinese patent application No. 201510149446.5, entitled "apparatus of four-surface flat wire-free packaging type millimeter wave radar transceiving assembly", discloses an encapsulated millimeter wave radar transceiving component which has an integrated box body and a cover plate, wherein components including a millimeter wave radar chip and an antenna are arranged on an inner surface of the box body by means of wire bonding, and a cavity is formed between the box body and the cover plate. However, insufficiencies of this encapsulated millimeter wave radar transceiving component lie in that the chips are arranged by wire bonding, which leads not only to too long wire and higher losses, but also to a higher thickness of the component, because a certain height is reserved in the box body for the wire of wire bonding. Furthermore, the manufacturing of this encapsulated millimeter wave radar transceiving component adopts a traditional packaging process including steps of mounting chips, bonding wires, and fabricating substrates, so that the thicknesses of substrates and chips hinder a further reduction of the thickness of the component.

SUMMARY OF THE INVENTION

It is an object of the invention to provide a millimeter wave radar component package and a method for manufacturing such millimeter wave radar component package, which may reduce losses and substantially decrease thickness of the package.

In a first aspect of the invention, this object is solved by a millimeter wave radar component package, comprising: a box cover, having a metal layer arranged on inner surface of the box cover, the metal layer facing a channel of a box body, wherein a cavity is formed between the box cover and the box body; and the box body, comprising:
a first insulator, connected with the box cover, wherein in the first insulator a channel is opened, and one end of the channel corresponds with the position of antenna and the other end is connected with the cavity;
one or more chips, arranged on a second insulator in a flip chip manner and covered by the first insulator;
the second insulator, arranged between the first insulator and a third insulator;
the third insulator; and
the antenna and conductive lines, arranged in the third insulator and connected with pads of the one or more chips through the second insulator, wherein the conductive lines are exposed from the third insulator for electrical contact.

In a second aspect of the invention, this object is solved by a millimeter wave radar component package, comprising:
a box cover, having a metal layer arranged on inner surface of the box cover, the metal layer facing a channel of a box body, wherein a cavity is formed between the box cover and the box body; and the box body, comprising:
a first insulator, connected with the box cover, wherein in the first insulator a channel is opened, one end of which corresponds with the position of antenna and the other end of which is connected with the cavity;
one or more chips, arranged on a second insulator in a flip chip manner and covered by the first insulator;
the second insulator, arranged between the first insulator and a third insulator;
the third insulator; and
the antenna and conductive lines, arranged in the third insulator and connected with pads of the one or more chips through the second insulator, wherein a metal barrier layer is arranged respectively between the antenna and the pads and between the conductive lines and the pads, and the conductive lines are exposed from the third insulator for electrical contact.

The millimeter wave radar component package according to the invention has at least the following advantages: (1) the millimeter wave radar component package according to the invention has a relatively low loss, because the chips of the package are arranged in flip chip manner, so that the lengths of wires are reduced, thereby decreasing the loss; (2) in the present invention, the thickness of the entire package may be reduced by embedding the chips, the antenna and the conductive lines into respective insulators of the box body; (3) in the present invention, because the chips, the antenna and the conductive lines are embedded into respective insulators of the box body and the conductive lines are exposed (i.e. Fan Out Package), the substrate may be omitted, thereby further reducing the thickness of the package.

In an embodiment of the invention, it is provided that, the chips further comprise solder balls or other metal connectors, which are arranged on the third insulator and which are electrically connected with the conductive lines. In this context, the solder balls or other metal connectors are electrically connected with the conductive lines through a part of the third insulator. The solder balls or other metal connectors serve to interconnect the conductive lines of the millimeter wave radar component package with other external devices, such as another substrate.

In another embodiment of the invention, it is provided that, the chips comprise:

a millimeter wave radar chip, which comprises a receiver chip, a radar transmitter chip, and/or a radar transceiver chip; and one or more of the following: a driver chip, a multi-functional chip, an final power amplifier, a low noise amplifier, a limiter, a preselected filter, a radio-frequency switch, a drive and control circuit, a power modulation circuit for timing of respective chips, and a power management circuit for voltage conversion.

By means of this embodiment, the millimeter wave radar chip and the related functional chips may be integrated in the same package, so that the integration degree can be enhanced.

In another embodiment of the invention, it is provided that, the box cover is made of polytetrafluoroethylene. Polytetrafluoroethylene has a relatively low dielectric constant, and therefore, it is suitable to serve as material for box cover.

In yet another embodiment of the invention, it is provided that, the antenna comprises titanium, copper, nickel, aluminum, silver, gold or alloys thereof, and the shape of the antenna is round, square or irregular. By means of this embodiment, the materials and shapes of the antenna may be flexibly selected for different scenarios.

In another embodiment of the invention, the size of the channel is smaller than that of the antenna. In the present invention, the arrangement of the channel serves to facilitate a reception and transmission of signal by the antenna. When the area of the opening of the channel is smaller than the area of the antenna, a good reception and transmission of antenna signal may be realized. The channel may be formed by drilling, etching, chemical erosion, lithography and etc.

In yet another embodiment of the invention, it is provided that, the first insulator, the second insulator and the third insulator may be made of same or different materials. By means of this embodiment, the materials of the first, second and third insulators may be flexibly selected to achieve respective characteristics.

In yet another embodiment of the invention, it is provided that, the metal barrier layer comprises TiCu or TiWCu, and has a thickness of 1-10 μm. In the present invention, the metal barrier layer serves as etching stopping layer when etching the second insulator or opening the channel, and furthermore, it realizes electrical contact between the pads of the chips and the conductive lines. By means of this embodiment, a metal barrier layer with good etching stopping function and electrically conducting function may be realized.

In another embodiment of the invention, the metal layer faces the channel in an aligned manner. In this context, the term "face in an aligned manner" means that, the centers of the channel and the metal layer are co-linear in direction of the thickness of the package. In this context, an optimal reception and transmission of the antenna signal may be ensured. However, it should be pointed out that, the metal layer does not necessarily face the channel in an aligned manner, instead, in other embodiments, the metal layer may be offset from the channel by a distance in direction of the thickness of the package.

In another embodiment of the invention, it is provided that, the metal layer comprises titanium, copper, nickel, tungsten, silver, gold or alloys thereof. By means of this embodiment, a good reception and transmission of the antenna signal may be realized.

In a third aspect of the invention, the aforementioned object is realized by a method for manufacturing a millimeter wave radar component package, comprising:

a. mounting one or more chips onto a temporary bonding layer of a carrier in a flip chip manner;

b. covering the chips with a first insulator by means of molding to form a box body and removing the carrier and the temporary bonding material to expose pads of the chips;

c. depositing a metal barrier layer on the surface of the box body on which the pads are located, and removing excessive metal barrier layer;

d. applying a second insulator on the surface of the box body on which the barrier layer is located, and removing a part of the second insulator to expose the pads of the chips;

e. arranging an antenna and conductive lines on the second insulator, and connecting the antenna and the conductive lines with the pads of the chips;

f. applying a third insulator on the surface of the box body on which the second insulator is located, and removing a part of the third insulator for electrical contacting the conductive lines;

g. forming a channel on the surface of the box body opposite to the third insulator, and removing the metal barrier layer on the bottom of the channel, and one end of the channel corresponding with the position of the antenna, and the other end of the channel is opened outwards;

h. forming a box cover, wherein on an inner surface of the box cover, a metal layer is formed, and the position of the metal layer corresponds with the position of the channel; and i. joining together the box cover with the surface of the box body opposite to the third insulator, wherein a cavity is formed between the box cover and the box body.

The method according to the invention also has the advantages the millimeter wave radar component package according to the invention, i.e. reducing loss and thickness of the package.

In an embodiment of the invention, it is provided that, the method further comprises:

arranging solder balls in parts of the third insulator which are removed for electrically contacting the conductive lines, the solder balls being electrically connected with the conductive lines.

By means of this embodiment, a conductive interconnect is realized between the package and other substrates. It should be pointed out that, the arrangement of the solder balls on the package is not necessarily required, and in other embodiments, pads may be arranged, or the solder balls may be arranged on another substrate to be interconnected.

In another embodiment of the invention, it is provided that, the step i is performed in vacuum, or a protective gas is filled in the cavity. A cavity that is vacuum or filled with protective gas may provide a gas-tight environment which internal respective bare chips require for their long-term reliable operation, and it meanwhile serves for electromagnetic shielding. By means of this preferred embodiment, a good reception and transmission of the antenna signal may be realized. However, it should be pointed out that, the vacuum environment or the protective gas in the cavity is not necessarily required, instead, air may be filled in the cavity of the millimeter wave radar component package of the invention.

BRIEF DESCRIPTION OF THE DRAWINGS

The invention is set forth below in more detail with reference to the detailed embodiments in conjunction with the drawings.

DETAILED DESCRIPTION OF THE INVENTION

Figure 1:
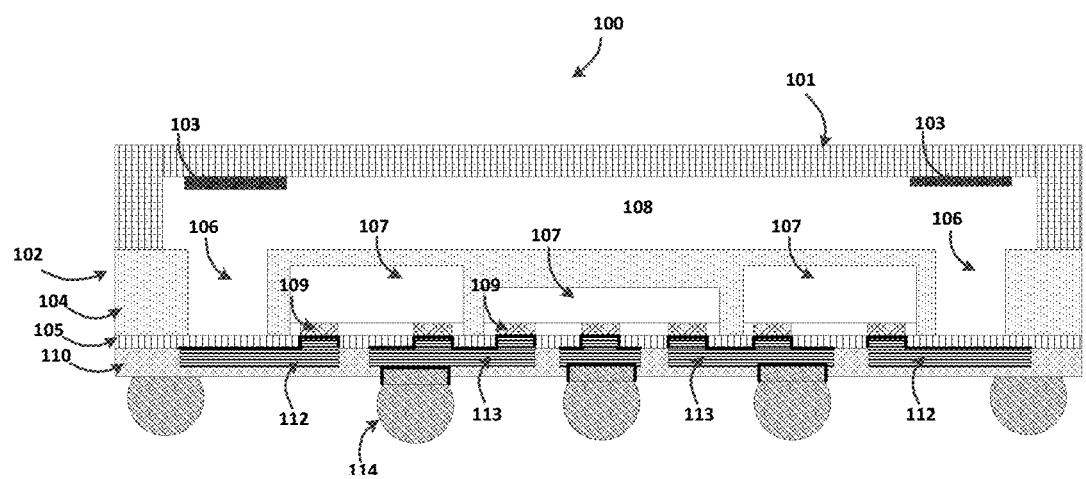
FIG. 1 illustrates a schematic view of the millimeter wave radar component package according to the invention.

It should be pointed out that, components in the drawings may be shown in an exaggerated form for the purpose of illustration, instead of being true to scale. In the drawings, same or functionally same components are provided with same reference numerals.

Unless otherwise specified, in the present application, the articles "a" and "an" do not exclude scenarios with multiple elements.

FIG. 1 illustrates a schematic view of the millimeter wave radar component package 100 according to the invention.

As shown in FIG. 1, the millimeter wave radar component package 100 according to the invention includes a box cover 101 and a box body 102.

The box cover 101 may be made of a low dielectric constant material, for example, Polytetrafluoroethylene. On an inner surface of the box cover 101, a metal layer 103 is arranged which is made of, for example, titanium, copper, nickel, tungsten, silver, gold or alloys thereof. The reception and transmission of signal by antenna 112 may be facilitated by arranging metal layer 103 and in conjunction with the channel 106.

A cavity 108 is formed between the box cover 101 and the box body 102, and the cavity 108 may also be vacuum or be filled with protective gas. The cavity 108 that is vacuum or filled with protective gas may provide a gas-tight environment which internal respective bare chips 107 require for their long-term reliable operation, and it meanwhile serves for electromagnetic shielding. However, it should be pointed out that, the vacuum environment or the protective gas in the cavity 108 is not necessarily required, instead, air may be filled in the cavity 108 of the millimeter wave radar component package 100 of the invention.

The box body 102 has a first insulator 104, a second insulator 105 and a third insulator 110, which are arranged in direction of the thickness of the chips. The first insulator 104, the second insulator 105 and the third insulator 110 may be, for example, made of same or different insulation materials such as insulation resin. The first insulator 104 is connected with the box cover 101, wherein a channel 106 is opened in the first insulator 104, and one end of the channel 106 corresponds with the position of antenna 112 and the other end is connected with the cavity 108. By arranging the channel 106, the reception and transmission of signal by the antenna 112 may be facilitated. The channel 106 may be formed by drilling, etching, chemical erosion, lithography or other processes. The metal layer 103 is preferably arranged to face the channel 106 in an aligned manner. In this context, the term "face in an aligned manner" means that, the centers of the channel 106 and the metal layer 103 are approximately co-linear in direction of the thickness of the package 100. By such an aligned arrangement, an optimal reception and transmission of the antenna signal may be ensured. However, it should be pointed out that, the metal layer 103 does not necessarily face the channel 106 in an aligned manner, instead, in other embodiments, the metal layer 103 may be offset from the channel 106 by a certain distance in direction of the thickness of the package.

The box body 102 further has one or more chips 107, which are arranged on the second insulator 105 in a flip chip manner and which are covered by the first insulator 104. The chips 107 include a millimeter wave radar chip and other functional chips. The millimeter wave radar chip has, for example, a transmitting terminal (Tx) and a receiving terminal (Rx) which are connected with the antenna 112.

The box body 102 has the antenna 112 and conductive lines 113, which are arranged in the third insulator 110 and which are connected with pads 109 of the chips 107 through the second insulator 105, wherein the conductive lines 113 are exposed from the third insulator 110 for electrical contact.

The millimeter wave radar component package 100 according to the invention has at least the following advantages: (1) the millimeter wave radar component package 100 according to the invention has a relatively low loss, because the chips of the package 100 are arranged in flip chip manner, so that the lengths of wires are reduced, thereby decreasing the loss; (2) in the present invention, by embedding the chips 107, the antenna 112 and the conductive lines 113 into respective insulators of the box body 101, (specifically, the antenna 112 is arranged in the first insulator 104, and the conductive lines 113 of the antenna 112 are arranged in the second and third insulators 105, 110 (i.e. the redistribution layer RDL)), the thickness of the entire package 100 may be reduced; (3) in the present invention, because the chips 107, the antenna 112 and the conductive lines 113 are embedded into respective insulators of the box body 102 and the conductive lines 113 are exposed (i.e. Fan Out Package), the substrate may be omitted, thereby further reducing the thickness of the package.

Figure 2:
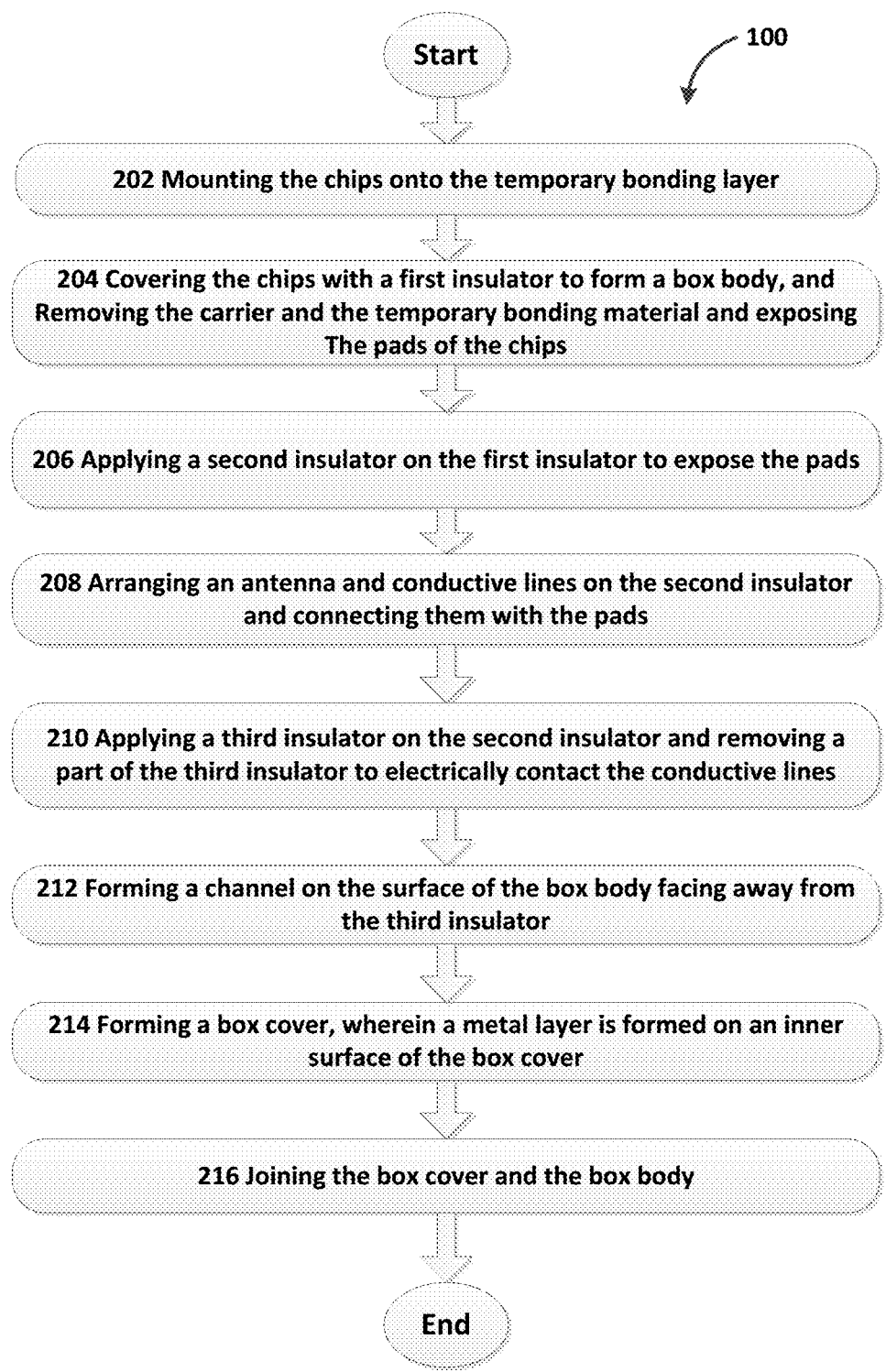
FIG. 2 illustrates a flowchart of the method for manufacturing millimeter wave radar component package according to the invention.

FIG. 2 illustrates a flowchart of the method for manufacturing millimeter wave radar component package 100 according to the invention.

In a step 202, one or more chips 107 are mounted onto a temporary bonding layer 115 of a carrier 116 in a flip chip manner.

In a step 204, the chips 107 are covered with a first insulator 104 by means of molding to form a box body 102, and the carrier 116 and the temporary bonding material 115 are removed to expose pads 109 of the chips 107.

In a step 206, a second insulator 105 is applied on the first insulator, and a part of the second insulator 105 is removed to expose pads 109 of the chips 107.

In a step 208, an antenna 112 and conductive lines 113 are arranged on the second insulator 105, and the antenna 112 and conductive lines 113 are connected with the pads 109 of the chips 107.

In a step 210, a third insulator 110 is applied on the surface of the box body 102 on which the second insulator 105 is located, and a part of the third insulator 110 is removed for electrical contacting the conductive lines 113. The step 210 may optionally include: arranging solder balls 114 in parts of the third insulator 110 which are removed for electrically contacting the conductive lines 113, wherein the solder balls 114 are electrically connected with the conductive lines 113.

In a step 212, a channel 106 is formed on the surface of the box body 102 opposite to the third insulator 110, and one end of the channel 106 corresponds with the position of the antenna 112, and the other end is opened outwards. The depth of the channel 106 may be set that it goes through the first insulator 104 until to the second insulator 105.

In a step 214, a box cover 101 is formed, wherein on an inner surface of the box cover 101, a metal layer 103 is formed, and the position of metal layer 103 corresponds with the position of the channel 106.

Finally in a step 216, the box cover 101 is joined together with the surface of the box body 102 opposite to the third insulator 110, wherein a cavity 108 is formed between the box cover 101 and the box body 102.

Figure 3:
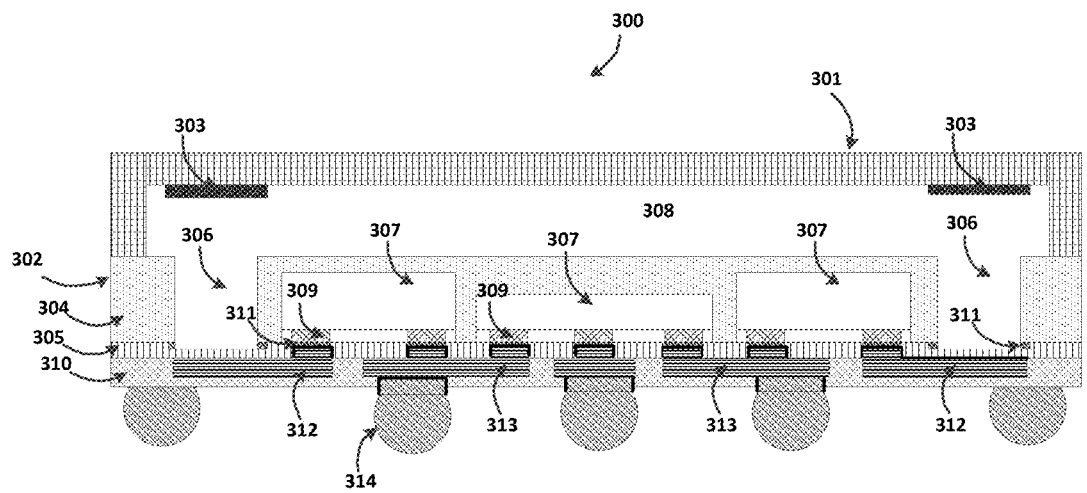
FIG. 3 illustrates a schematic view of the millimeter wave radar component package according to the invention.

FIG. 3 illustrates a schematic view of the millimeter wave radar component package 300 according to the invention.

As shown in FIG. 3, the millimeter wave radar component package 300 according to the invention includes a box cover 301 and a box body 302.

The box cover 301 may be made of a low dielectric constant material, for example, Polytetrafluoroethylene. On an inner surface of the box cover 301, a metal layer 303 is arranged which is made of, for example, titanium, copper, nickel, tungsten, silver, gold or alloys thereof. By arranging metal layer 303 and in conjunction with the channel 306, the reception and transmission of antenna signal may be facilitated by arranging metal layer 303 and in conjunction with the channel 306.

A cavity 308 is formed between the box cover 301 and the box body 302, and the cavity 308 may also be vacuum or be filled with protective gas. The cavity 308 that is vacuum or filled with protective gas may provide a gas-tight environment which internal respective bare chips 307 require for their long-term reliable operation, and it meanwhile serves for electromagnetic shielding. However, it should be pointed out that, the vacuum environment or the protective gas in the cavity 308 is not necessarily required, instead, air may be filled in the cavity 308 of the millimeter wave radar component package 300 of the invention.

The box body 302 has a first insulator 304, a second insulator 305 and a third insulator 310, which are arranged in direction of the thickness of the chips. The first insulator 304, the second insulator 305 and the third insulator 310 may be, for example, made of same or different insulation materials, such as insulation resin. The first insulator 304 is connected with the box cover 301, wherein a channel 306 is opened in the first insulator 304, and one end of channel 306 corresponds with the position of antenna 312 and the other end is connected with the cavity 308. By arranging the channel 306, the reception and transmission of signal by the antenna 312 may be facilitated. The channel 306 may be formed by drilling, etching, chemical erosion, lithography or other processes. The metal layer 303 is preferably arranged to face the channel 306 in an aligned manner. In this context, the term "face in an aligned manner" means that, the centers of the channel 306 and the metal layer 303 are approximately co-linear in direction of the thickness of the package 300. By such an aligned arrangement, an optimal reception and transmission of the antenna signal may be ensured. However, it should be pointed out that, the metal layer 303 does not necessarily face the channel 306 in an aligned manner, instead, in other embodiments, the metal layer 303 may be offset from the channel 306 by a certain distance in direction of the thickness of the package.

The box body 302 further has one or more chips 307, which are arranged on the second insulator 305 in a flip chip manner and which are covered by the first insulator 304. The chips 307 include a millimeter wave radar chip and other functional chips. The millimeter wave radar chip has, for example, a transmitting terminal (Tx) and a receiving terminal (Rx) which are connected with the antenna 312.

The box body 302 further has an antenna 312 and conductive lines 313, which are arranged in the third insulator 310 and which are connected with pads 309 of the chips 307 through the second insulator 305, wherein a metal barrier layer 311 is arranged respectively between the antenna 312 and the pads 309 and between the conductive lines 313 and the pads 309, and the conductive lines 313 are exposed from the third insulator 310 for electrical contact. The metal barrier layer 311 serves as a etching stopping layer when etching the second insulator 305 and opening the channel 306, therefore, the metal barrier layer 311 should be deposited on the pads 309 of the chips 307 and the position on the first insulator 304 where a channel 307 should be opened, wherein the metal barrier layer 311 serves as a etching stopping layer in these positions to achieve desired etching depth. Furthermore, the metal barrier layer 311 also allows for the electrical contact between the pads 109 of the chips 307 and the conductive lines 313. The metal barrier layer may, for example, have TiCu or TiWCu, and have a thickness of 1-10 µm.

The millimeter wave radar component package 300 according to the invention has at least the following advantages: (1) the millimeter wave radar component package 300 according to the invention has a relatively low loss, because the chips of the package 300 are arranged in flip chip manner, so that the lengths of wires are reduced, thereby decreasing the loss; (2) in the present invention, by embedding the chips 307, the antenna 312 and the conductive lines 313 into respective insulators of the box body 301, (specifically, the antenna 312 is arranged in the first insulator 304, and the conductive lines 313 of the antenna 312 are arranged in the second and third insulators 305, 310 (i.e. the redistribution layer RDL)), the thickness of the entire package 300 may be reduced; (3) in the present invention, because the chips 307, the antenna 312 and the conductive lines 313 are embedded into respective insulators of the box body 302 and the conductive lines 313 are exposed (i.e. Fan Out Package), the substrate may be omitted, thereby further reducing the thickness of the package.

FIG. 4a-4f illustrate schematic views of the package at the end of each step of the method for manufacturing millimeter wave radar component package 300 according to the invention.

Figure 4A:
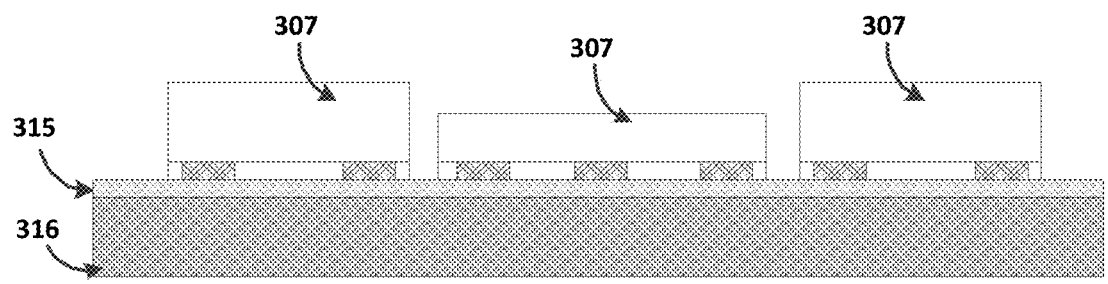
FIG. 4a-4i illustrate schematic views of the package at the end of each step of the method for manufacturing millimeter wave radar component package according to the invention.

FIG. 4a illustrates a schematic view of the package 300 at the end of a step a. In the step a, one or more chips 307 are mounted onto a temporary bonding layer 315 of a carrier 316 in a flip chip manner.

Figure 4B:
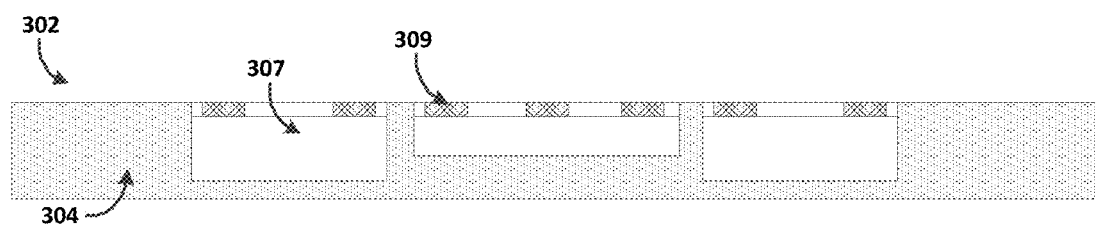

FIG. 4b illustrates a schematic view of the package 300 at the end of a step b. In the step b, the chips 307 are covered with a first insulator 304 by means of molding to form a box body 302, and the carrier 316 and the temporary bonding material 315 are removed to expose pads 309 of the chips 307.

Figure 4C:
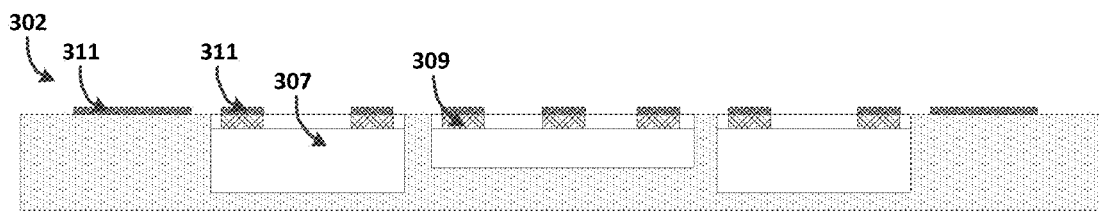

FIG. 4c illustrates a schematic view of the package 300 at the end of a step c. In the step c, a metal barrier layer 311 is deposited on the surface of the box body 302 on which the pads 309 are located, and excessive metal barrier layer 311 is removed. The metal barrier layer 311 serves as a etching stopping layer when etching the second insulator 305 and opening the channel 306, therefore, the metal barrier layer 311 should be deposited on the pads 309 of the chips 307 and the position on the first insulator 304 where a channel 307 should be opened, wherein the metal barrier layer 311 serves as a etching stopping layer in these positions to achieve desired etching depth. The metal barrier layer 311 may be formed by sputtering, electroplating, etching or other processes.

Figure 4D:
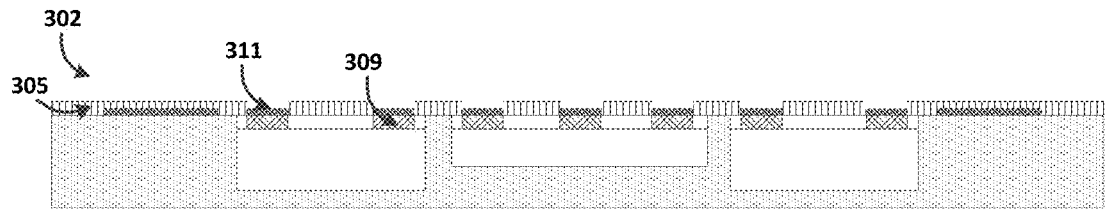

FIG. 4d illustrates a schematic view of the package 300 at the end of a step d. In the step d, a second insulator 305 is applied on the surface of the box body 302 on which the barrier layer 311 is located, and a part of the second insulator 305 is removed to expose the pads 309 of the chips 307.

Figure 4E:
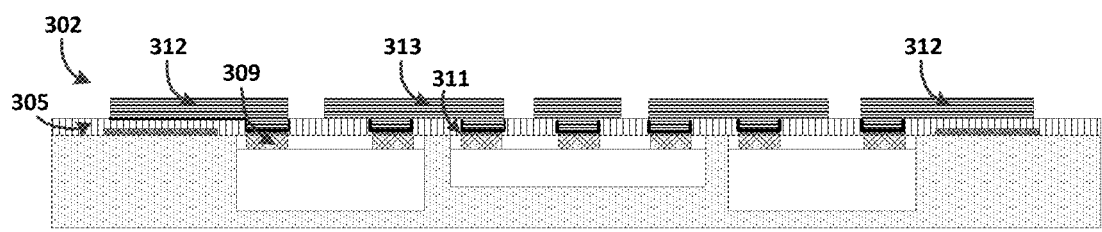

FIG. 4e illustrates a schematic view of the package 300 at the end of a step e. In the step e, an antenna 312 and conductive lines 313 are arranged on the second insulator 305, and the antenna 312 and conductive lines 313 are connected with the pads 309 of the chips 307. In this context, the antenna 312 and the conductive lines 313 are connected with the pads 309 via the metal barrier layer 311.

Figure 4F:
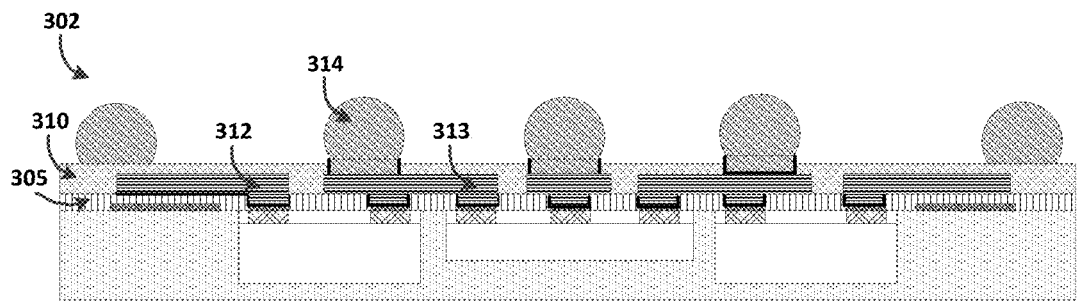

FIG. 4f illustrates a schematic view of the package 300 at the end of a step f. In the step f, a third insulator 310 is coated on the surface of the box body 302 on which the second insulator 305 is located, and a part of the third insulator 310 is removed for electrical contacting the conductive lines 313. The step f may optionally include: arranging solder balls 314 in parts of the third insulator 310 which are removed for electrically contacting the conductive lines 313, wherein the solder balls 314 are electrically connected with the conductive lines 313.

Figure 4G:
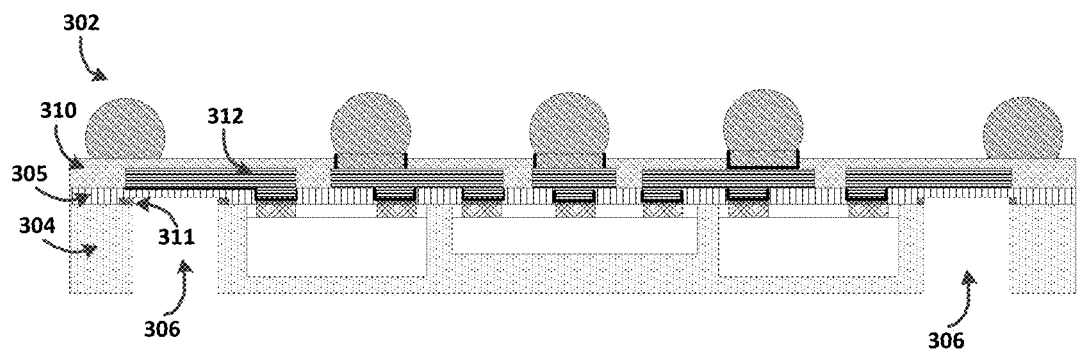

FIG. 4g illustrates a schematic view of the package 300 at the end of a step g. In the step g, a channel 306 is formed on the surface of the box body 302 opposite to the third insulator 310, and the metal barrier layer 311 on the bottom of the channel 306 is removed, and one end of the channel 306 corresponds with the position of the antenna 312, and the other end is opened outwards. The depth of channel 306 may be set that it goes through the first insulator 304 and the metal barrier layer 311 until to the second insulator 305.

Figure 4H:
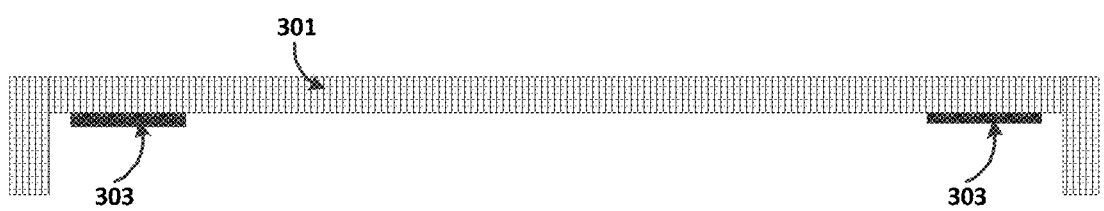

FIG. 4h illustrates a schematic view of the package 300 at the end of a step h. In the step h, a box cover 301 is formed, wherein on an inner surface of the box cover 301, a metal layer 303 is formed and the position of metal layer 303 corresponds with the position of the channel 306.

Figure 4I:
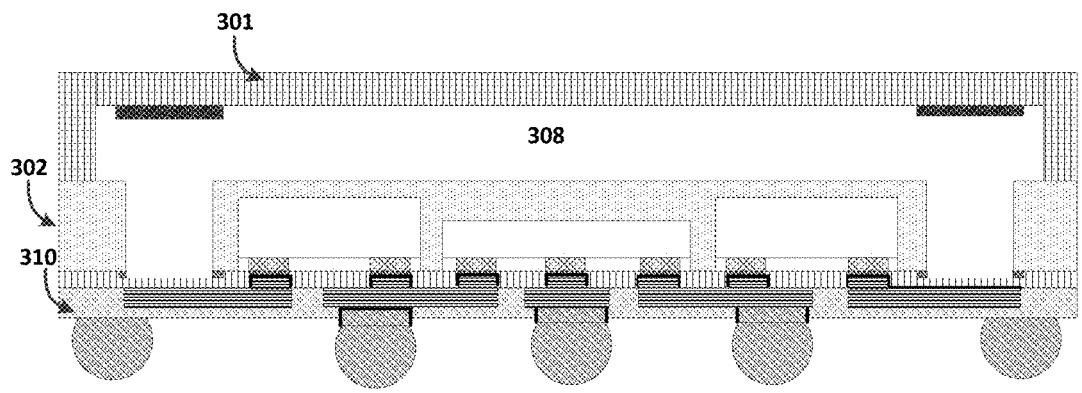

Finally, FIG. 4i illustrates a schematic view of the package 300 at the end of a step i. In the step i, the box cover 301 is joined together with the surface of the box body 302 opposite to the third insulator 310, wherein a cavity 308 is formed between the box cover 301 and the box body 302.

Although some embodiments of the invention are described in the present application document, those skilled in the art may understand that these embodiments are shown merely as examples. Under the teachings of the invention, various variations, alternatives and improvements are conceivable to those skilled in the art. The appended claims are intended to define the scope of the invention and hereby encompass the claims themselves and equivalent methods and structures.

What we claim is:

1. A millimeter wave radar component package, comprising:
   a box cover, having a metal layer arranged on inner surface of the box cover, the metal layer facing a channel of a box body, wherein a cavity is formed between the box cover and the box body; and
   the box body, comprising:
     a first insulator, connected with the box cover, wherein in the first insulator a channel is opened, and one end of the channel corresponds with the position of antenna and the other end is connected with the cavity;
     one or more chips, arranged on a second insulator in a flip chip manner and covered by the first insulator;
     the second insulator, arranged between the first insulator and a third insulator;
     the third insulator; and
     the antenna and conductive lines, arranged in the third insulator and connected with pads of the one or more chips through the second insulator, wherein the conductive lines are exposed from the second insulator and the third insulator for electrical contact.

2. A millimeter wave radar component package, comprising:
   a box cover, having a metal layer arranged on inner surface of the box cover, the metal layer facing a channel of a box body, wherein a cavity is formed between the box cover and the box body; and
   the box body, comprising:
     a first insulator, connected with the box cover, wherein in the first insulator a channel is opened, and one end of the channel corresponds with the position of antenna and the other end is connected with the cavity;
     one or more chips, arranged on a second insulatorn a trip chip manner and covered by the first insulator;
     the second insulator, arranged between the first insulator and a third insulator;
     the third insulator; and
     the antenna and conductive lines, arranged in the third insulator and connected with pads of the one or more chips through the second insulator, wherein a metal barrier layer is arranged respectively between the antenna and the pads and between the conductive lines and the pads, and the conductive lines are exposed from the second insulator and the third insulator for electrical contact.

3. The millimeter wave radar component package according to claim 2, further comprising solder balls or other metal connectors arranged on the third insulator and electrically connected with the conductive lines.

4. The millimeter ave radar component package according to claim 2, wherein the chips comprise:
   a millimeter wave radar chip, which comprises a receiver chip, a radar transmitter chip and/or a radar transceiver chip; and
   one or more of the following: a driver chip, a multi-functional chip, a final power amplifier, a low noise amplifier, a limiter, a preselected filter, radio-frequency switch, a drive and control circuit, a power modulation circuit for timing of respective chips, and a power management circuit for voltage conversion.

5. The millimeter wave radar component package according to claim 2, wherein the box cover is made of polytetrafluoroethylene.

6. The millimeter wave radar component package according to claim 2, wherein the antenna comprises titanium, copper, nickel, aluminum, silver, gold or alloys thereof, and the shape of the antenna is round, square or irregular.

7. The millimeter wave radar component package according to claim 2, wherein the size of the channel is smaller than the size of the antenna.

8. The millimeter wave radar component package according to claim 2, wherein the metal barrier layer comprises TiCu or TiWCu, and has a thickness of 1-10 μm.

9. The millimeter wave radar component package according to claim 2, wherein the metal layer comprises titanium, copper, nickel, tungsten, silver, gold or alloys thereof.

10. The millimeter wave radar component package according to claim 2, wherein the cavity is vacuum, or the cavity is filled with protective gas.

11. The millimeter wave radar component package according to claim 2, wherein the metal layer faces the channel in an aligned manner.

12. A method for manufacturing a millimeter wave radar component package, comprising:
 a. mounting one or more chips onto a temporary bonding layer of a carrier in a flip chip manner;
 b. covering the chips with a first insulator by means of molding to form a box body and removing the carrier and the temporary bonding layer to expose pads of the chips;
 c. depositing a metal barrier layer on the surface of the box body on which the pads are located, and removing excessive metal barrier layer;
 d. applying a second insulator on the surface of the box body on which the metal barrier layer is located, and removing a part of the second insulator to expose the pads of the chips;
 e. arranging an antenna and conductive lines on the second insulator, and connecting the antenna and the conductive lines with the pads of the chips;
 f. applying a third insulator on the surface of the box body on which the second insulator is located, and removing a part of the third insulator for electrical contacting the conductive lines;
 g. forming a channel on the surface of the box body opposite to the third insulator, and removing the metal barrier layer on the bottom of the channel, and one end of the channel corresponds with the position of the antenna, and the other end of the channel is opened outwards;
 h. forming a box cover, wherein on an inner surface of the box cover, a metal layer is formed, and the position of the metal layer corresponds with the position of the channel; and
 i. joining together the box cover with the surface of the box body opposite to the third insulator, wherein a cavity is formed between the box cover and the box body.

13. The method according to claim 12, further comprising:
 arranging solder balls in parts of the third insulator which are removed for electrically contacting the conductive lines, the solder balls being electrically connected with the conductive lines.

14. The method according to claim 12, wherein the step i is performed in vacuum, or a protective gas is filled in the cavity.

* * * * *